US012635441B2

(12) United States Patent
Niitsu et al.

(10) Patent No.: US 12,635,441 B2
(45) Date of Patent: May 19, 2026

(54) WAFER PROCESSING METHOD

(71) Applicant: DISCO CORPORATION, Tokyo (JP)

(72) Inventors: Keiichiro Niitsu, Tokyo (JP); Youngsuk Kim, Tokyo (JP); Koji Watanabe, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 605 days.

(21) Appl. No.: 18/159,117

(22) Filed: Jan. 25, 2023

(65) Prior Publication Data

US 2023/0298938 A1      Sep. 21, 2023

(30) Foreign Application Priority Data

Feb. 8, 2022      (JP) ................................. 2022-017937

(51) Int. Cl.
  *H10P 54/00*          (2026.01)
  *H10P 34/42*          (2026.01)
(52) U.S. Cl.
  CPC .............. *H10P 54/00* (2026.01); *H10P 34/42* (2026.01)
(58) Field of Classification Search
  None
  See application file for complete search history.

(56) References Cited

U.S. PATENT DOCUMENTS

| | | | | |
|---|---|---|---|---|
| 5,185,295 A | * | 2/1993 | Goto | H01L 21/30604 |
| | | | | 216/99 |
| 2004/0224483 A1 | * | 11/2004 | Takyu | H01L 21/78 |
| | | | | 438/464 |
| 2005/0035099 A1 | * | 2/2005 | Nakamura | B23K 26/40 |
| | | | | 219/121.72 |
| 2005/0035100 A1 | * | 2/2005 | Genda | B28D 5/022 |
| | | | | 219/121.72 |
| 2006/0009008 A1 | * | 1/2006 | Kaneuchi | H01L 21/67092 |
| | | | | 219/121.72 |
| 2008/0020548 A1 | * | 1/2008 | Morikazu | B23K 26/40 |
| | | | | 257/E21.599 |
| 2009/0191692 A1 | * | 7/2009 | Ilzuka | B23K 26/0853 |
| | | | | 257/E21.347 |
| 2016/0013105 A1 | * | 1/2016 | Van Der Stam | B23K 26/0608 |
| | | | | 438/462 |
| 2017/0140989 A1 | * | 5/2017 | Tabuchi | H01L 21/268 |
| 2022/0402070 A1 | * | 12/2022 | Jang | B23K 1/0056 |

FOREIGN PATENT DOCUMENTS

| | | |
|---|---|---|
| JP | 2004282037 A | 10/2004 |
| JP | 2005064231 A | 3/2005 |

OTHER PUBLICATIONS

Office Action issued in corresponding JP Patent Application No. 2022-017937, mailed Sep. 30, 2025.

* cited by examiner

*Primary Examiner* — Erik T.K. Peterson

(74) *Attorney, Agent, or Firm* — GREER BURNS & CRAIN, LTD.

(57)          ABSTRACT

First edge surface portions and second edge surface portions of first processed grooves and second processed grooves of a wafer are melted by being irradiated with a laser beam. Hence, top surfaces of the first edge surface portions and the second edge surface portions can be planarized, and damage caused to the first edge surface portions and the second edge surface portions can be repaired. As a result, the transverse rupture strength of chips formed by dividing the wafer can be enhanced.

11 Claims, 10 Drawing Sheets

| WAVELENGTH | PROCESSING RESULT |
|---|---|
| 266nm | DEFECTIVE |
| 355nm | DEFECTIVE<br><br>LASER BEAM WAS READILY ABSORBED AT WAFER SURFACE AND DEPTH OF MELTING WAS SHALLOW AND DEPTH FOR REPAIRING DAMAGE INCLUDING CRACKS WAS INSUFFICIENT |
| 500nm | FAVORABLE |
| 532nm | FAVORABLE |
| 800nm | FAVORABLE |
| 1000nm | FAVORABLE |
| 1064nm | DEFECTIVE<br><br>LASER BEAM WAS TRANSMITTED THROUGH WAFER AND INTERNAL PROCESSING WAS CAUSED WITHOUT MELTING AND CRACKS WERE FORMED WITH PART EXPANDED BY THE INTERNAL PROCESSING AS A STARTING POINT |

WAFER PROCESSING METHOD

BACKGROUND OF THE INVENTION

Field of the Invention

The present invention relates to a wafer processing method for forming processed grooves in a wafer.

Description of the Related Art

There is a technology of forming processed grooves in a wafer (see Japanese Patent Laid-Open No. 2005-064231).

SUMMARY OF THE INVENTION

However, when the processed grooves are formed in the wafer, such damage as cracks or chipping may be caused to the wafer.

It is accordingly an object of the present invention to provide a processing method capable of repairing at least part of damage caused by the formation of processed grooves.

In accordance with an aspect of the present invention, there is provided a wafer processing method for processing a wafer having a plurality of intersecting planned dividing lines formed on a top surface of the wafer, along the planned dividing lines, the wafer processing method including a processed groove forming step of forming processed grooves along the planned dividing lines, and an energy supply step of melting a part of at least one of a groove bottom, a side surface, and an edge surface of the processed grooves by supplying energy to the part, to repair at least part of damage caused by the processed groove forming step.

Preferably, a functional layer is laminated on the wafer, and the processed groove forming step includes forming a pair of processing preliminary grooves having a depth of removing at least the functional layer and forming a processed groove between the pair of processing preliminary grooves.

Preferably, the processed groove forming step divides the wafer into a plurality of chips by the processed grooves, and the energy supply step further includes a side surface exposing step of exposing side surfaces of chips to be supplied with the energy, by pushing up the chips to be supplied with the energy relative to the other chips, and supplies the side surfaces exposed in the side surface exposing step with the energy.

Preferably, the energy supply step is a step of applying a laser beam. Preferably, a wavelength of the laser beam is a wavelength absorbable by the wafer.

Preferably, a functional layer is laminated on the wafer, and the energy supply step supplies the energy to a part including the functional layer in at least one of the groove bottom, the side surface, and the edge surface of the processed grooves, to repair at least part of damage caused to the part including the functional layer.

In the present processing method, after the processed groove forming step, the energy supply step is performed to supply energy to the part of at least one of the groove bottom, the side surface, and the edge surface of the processed grooves, and this part (laser-irradiated part) is thereby melted and recrystallized. The melting can planarize the laser-irradiated part and bond cracks, chipping, and the like caused by the formation of the processed grooves, so that damage to the laser-irradiated part can be reduced. That is, at least part of the damage can be repaired. As a result, the transverse rupture strength of the chips formed by dividing the wafer can be enhanced.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 14 is a table illustrating relations between wavelengths of laser beams emitted from a laser oscillator and results of a melting step performed by use of the respective laser beams.

DETAILED DESCRIPTION OF THE PREFERRED EMBODIMENT

Figure 1:
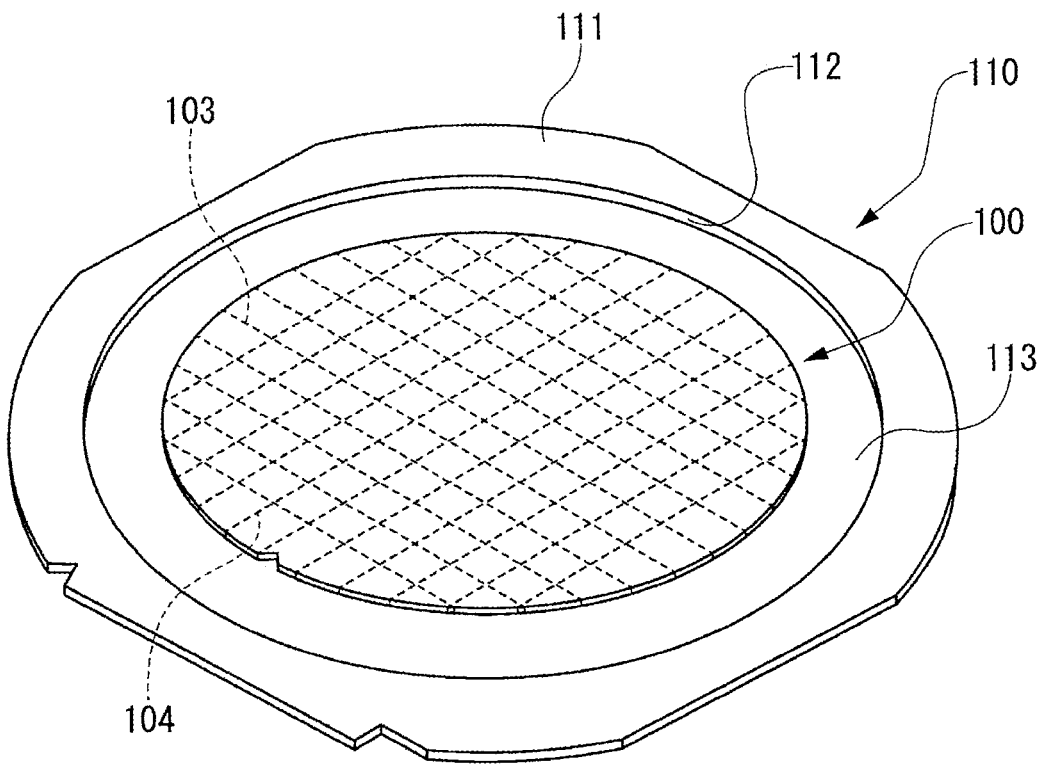
FIG. 1 is a perspective view illustrating a frame unit including a wafer.

In an embodiment of the present invention, a wafer 100 as illustrated in FIG. 1 is used as a workpiece. The wafer 100 has a circular shape. A plurality of first planned dividing lines 103 extending in a first direction and a plurality of second planned dividing lines 104 extending in a second direction orthogonal to the first direction are formed on a top surface of the wafer 100. An unillustrated device, for example, may be formed in each of regions demarcated by the first planned dividing lines 103 and the second planned dividing lines 104.

In the present embodiment, as illustrated in FIG. 1, the wafer 100 is handled in a state of a frame unit 110. The frame unit 110 is formed by integrating an annular frame 111 having an opening 112 capable of housing the wafer 100 and the wafer 100 positioned in the opening 112 of the annular frame 111 with each other by a dicing tape 113. In the present embodiment, the wafer 100 is processed in the state of such a frame unit 110 in a processing system 1 illustrated in FIG. 2.

Figure 2:
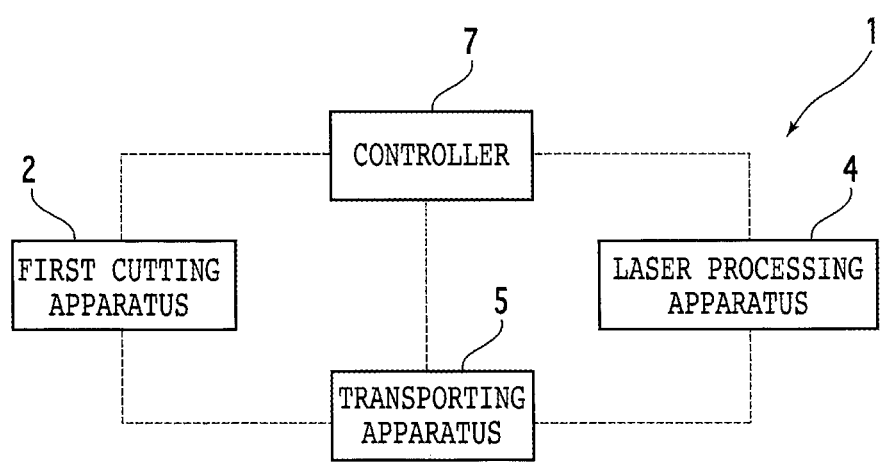
FIG. 2 is a block diagram illustrating a configuration of a processing system.

The processing system 1 illustrated in FIG. 2 is a system for processing the wafer 100. The processing system 1 includes a first cutting apparatus 2 that performs cutting processing on the wafer 100, a laser processing apparatus 4 that performs laser processing on the wafer 100, a transporting apparatus 5 that transports the wafer 100 between the first cutting apparatus 2 and the laser processing apparatus 4, and a controller 7 that controls these apparatuses.

Figure 3:
FIG. 3 is a perspective view illustrating a configuration of a first cutting apparatus.
Figure 3:
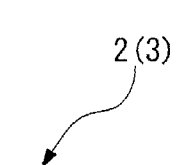

A configuration of the first cutting apparatus 2 will first be described. As illustrated in FIG. 3, the first cutting apparatus 2 has a base 10, and a processing feed mechanism 14 is disposed on the base 10. The processing feed mechanism 14 moves a holding unit 20 including a holding table 21 relative to a first cutting blade 46 of a cutting mechanism 45 along a processing feed direction (X-axis direction) parallel with a holding surface 22 of the holding table 21.

The processing feed mechanism 14 includes a pair of guide rails 15 extending in the X-axis direction, an X-axis table 16 mounted on the guide rails 15, a ball screw 17 extending in parallel with the guide rails 15, and a motor 18 that rotates the ball screw 17.

The pair of guide rails 15 is arranged on an upper surface of the base 10 to be parallel with the X-axis direction. The X-axis table 16 is installed on the pair of guide rails 15 to be slidable along these guide rails 15. The holding unit 20 is mounted on the X-axis table 16.

The ball screw 17 is screwed into a nut portion (not illustrated) provided in the X-axis table 16. The motor 18 is connected to one end portion of the ball screw 17, and rotationally drives the ball screw 17. When the ball screw 17 is rotationally driven, the X-axis table 16 and the holding unit 20 move along the guide rails 15, that is, along the X-axis direction as the processing feed direction.

The holding unit 20 includes the holding table 21 that holds the wafer 100 (see FIG. 1) of the frame unit 110, a cover plate 24 disposed on the periphery of the holding table 21, and two clamp units 25 provided on the periphery of the holding table 21. In addition, the holding unit 20 has, under the cover plate 24, a 6 table 23 that supports the holding table 21 and rotates the holding table 21 within an XY plane.

The holding table 21 is a member for holding the wafer 100 illustrated in FIG. 1. The holding table 21 is formed in a disk shape. The holding table 21 has the holding surface 22 formed of a porous material. The holding surface 22 can communicate with an unillustrated suction source. The holding table 21 holds under suction the wafer 100 in the frame unit 110 by the holding surface 22.

The two clamp units 25 provided on the periphery of the holding table 21 hold and fix the annular frame 111 on the periphery of the wafer 100 held on the holding table 21.

A gate-shaped column 11 is erected on a rearward side (−X direction side) on the base 10 to straddle the processing feed mechanism 14. A cutting mechanism moving mechanism 13 that moves the cutting mechanism 45 is provided to the front surface (surface on a +X direction side) of the gate-shaped column 11.

The cutting mechanism moving mechanism 13 indexing-feeds the cutting mechanism 45 in a Y-axis direction, and cutting-feeds the cutting mechanism 45 in a Z-axis direction. The cutting mechanism moving mechanism 13 includes an indexing feed mechanism 30 that moves the cutting mechanism 45 in an indexing feed direction (Y-axis direction) and a cutting feed mechanism 40 that moves the cutting mechanism 45 in a cutting feed direction (Z-axis direction).

The indexing feed mechanism 30 is disposed on the front surface of the gate-shaped column 11. The indexing feed mechanism 30 adjusts the position of the cutting mechanism 45 in the Y-axis direction by reciprocating the cutting feed mechanism 40 and the cutting mechanism 45 along the Y-axis direction.

The indexing feed mechanism 30 includes a pair of guide rails 31 extending in the Y-axis direction, a Y-axis table 34 mounted on the guide rails 31, a ball screw 32 extending in parallel with the guide rails 31, and a motor 33 that rotates the ball screw 32.

The pair of guide rails 31 is disposed on the front surface of the gate-shaped column 11 to be parallel with the Y-axis direction. The Y-axis table 34 is installed on the pair of guide rails 31 to be slidable along these guide rails 31. The cutting feed mechanism 40 and the cutting mechanism 45 are attached onto the Y-axis table 34.

The ball screw 32 is screwed into a nut portion (not illustrated) provided in the Y-axis table 34. The motor 33 is connected to one end portion of the ball screw 32, and rotationally drives the ball screw 32. When the ball screw 32 is rotationally driven, the Y-axis table 34, the cutting feed mechanism 40, and the cutting mechanism 45 move in the Y-axis direction as the indexing feed direction along the guide rails 31.

The cutting feed mechanism 40 reciprocates the cutting mechanism 45 along the Z-axis direction (upward-downward direction). The Z-axis direction is a direction orthogonal to the X-axis direction and the Y-axis direction and orthogonal to the holding surface 22 of the holding table 21.

The cutting feed mechanism 40 includes a pair of guide rails 41 extending in the Z-axis direction, a supporting member 42 mounted on the guide rails 41, a ball screw 43 extending in parallel with the guide rails 41, and a motor 44 that rotates the ball screw 43.

The pair of guide rails 41 is arranged on the Y-axis table 34 to be parallel with the Z-axis direction. The supporting member 42 includes an imaging mechanism 48. The supporting member 42 is installed on the pair of guide rails 41 to be slidable along these guide rails 41. The cutting mechanism 45 is attached to a lower end portion of the supporting member 42.

The ball screw 43 is screwed into a nut portion (not illustrated) provided to the back side of the supporting member 42. The motor 44 is connected to one end portion of the ball screw 43, and rotationally drives the ball screw 43. When the ball screw 43 is rotationally driven, the supporting member 42 and the cutting mechanism 45 move in the Z-axis direction as the cutting feed direction along the guide rails 41.

The cutting mechanism 45 cuts the wafer 100 held on the holding table 21. The cutting mechanism 45 supports in a rotatable manner the first cutting blade 46 that cuts the wafer 100.

In addition to the first cutting blade 46, the cutting mechanism 45 includes a spindle that rotates with the first cutting blade 46 fitted thereto, a housing that supports the spindle in a rotatable manner, a motor that rotationally drives the spindle, and the like (none is illustrated). The cutting mechanism 45 performs cutting processing on the wafer 100 by the first cutting blade 46 rotated at high speed together with the spindle by the motor.

Figure 4:
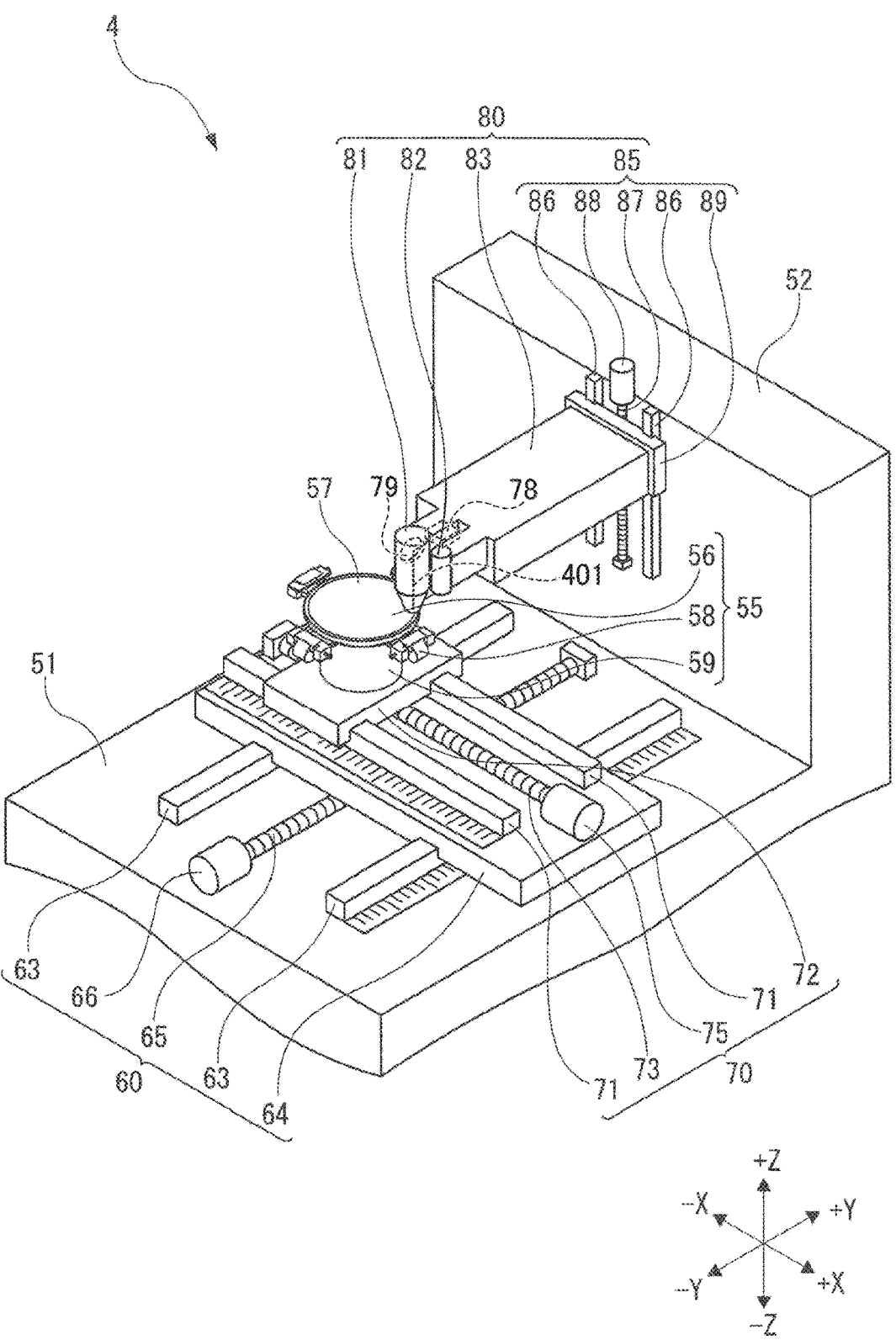
FIG. 4 is a perspective view illustrating a configuration of a laser processing apparatus.

A configuration of the laser processing apparatus 4 will next be described. As illustrated in FIG. 4, the laser processing apparatus 4 includes a base 51 in a rectangular parallelepipedic shape and an erected wall portion 52 erected on one end of the base 51.

Provided on the upper surface of the base 51 are a holding unit 55 including a holding table 56, a Y-axis moving mechanism 60 that moves the holding table 56 in the Y-axis direction as the indexing feed direction, and an X-axis moving mechanism 70 that moves the holding table 56 in the X-axis direction as the processing feed direction. The holding table 56 has a holding surface 57 for holding the wafer 100.

The Y-axis moving mechanism 60 moves the holding table 56 in the Y-axis direction parallel with the holding surface 57 relative to a laser beam irradiating unit 80. The Y-axis moving mechanism 60 includes a pair of guide rails 63 extending in the Y-axis direction, a Y-axis table 64 mounted on the guide rails 63, a ball screw 65 extending in parallel with the guide rails 63, and a driving motor 66 that rotates the ball screw 65.

The pair of guide rails 63 is disposed on an upper surface of the base 51 to be parallel with the Y-axis direction. The Y-axis table 64 is installed on the pair of guide rails 63 to be slidable along these guide rails 63. The X-axis moving mechanism 70 and the holding unit 55 are mounted on the Y-axis table 64.

The ball screw 65 is screwed into a nut portion (not illustrated) provided in the Y-axis table 64. The driving motor 66 is connected to one end portion of the ball screw 65, and rotationally drives the ball screw 65. When the ball screw 65 is rotationally driven, the Y-axis table 64, the X-axis moving mechanism 70, and the holding unit 55 move in the Y-axis direction along the guide rails 63.

The X-axis moving mechanism 70 moves the holding table 56 in the X-axis direction parallel with the holding surface 57 relative to the laser beam irradiating unit 80. The X-axis moving mechanism 70 includes a pair of guide rails 71 extending in the X-axis direction, an X-axis table 72 mounted on the guide rails 71, a ball screw 73 extending in parallel with the guide rails 71, and a driving motor 75 that rotates the ball screw 73.

The pair of guide rails 71 is disposed on the upper surface of the Y-axis table 64 to be parallel with the X-axis direction. The X-axis table 72 is installed on the pair of guide rails 71 to be slidable along these guide rails 71. The holding unit 55 is mounted on the X-axis table 72.

The ball screw 73 is screwed into a nut portion (not illustrated) provided in the X-axis table 72. The driving motor 75 is connected to one end portion of the ball screw 73, and rotationally drives the ball screw 73. When the ball screw 73 is rotationally driven, the X-axis table 72 and the holding unit 55 move in the processing feed direction (X-axis direction) along the guide rails 71.

The holding unit 55 is used to hold the wafer 100. In the present embodiment, the holding unit 55 holds the wafer 100 as the frame unit 110 illustrated in FIG. 1.

The holding unit 55 includes the holding table 56 that holds the wafer 100, four clamp units 58 provided on the periphery of the holding table 56, and a 6 table 59 that supports the holding table 56 and rotates the holding table 56 within the XY plane.

The holding table 56 is a member for holding the wafer 100. The holding table 56 is formed in a disk shape. The holding table 56 has the holding surface 57 formed of a porous material. The holding surface 57 can communicate with an unillustrated suction source. The holding table 56 holds under suction the wafer 100 in the frame unit 110 by the holding surface 57.

The four clamp units 58 provided on the periphery of the holding table 56 hold and fix, from four sides, the annular frame 111 on the periphery of the wafer 100 held on the holding table 56.

The laser beam irradiating unit 80 is provided to the front surface of the erected wall portion 52 of the laser processing apparatus 4. The laser beam irradiating unit 80 irradiates the wafer 100 held on the holding table 56 with a laser beam. The laser beam irradiating unit 80 includes a processing head (condenser) 81 that irradiates the wafer 100 with the laser beam, a camera 82 that images the wafer 100, an arm section 83 that supports the processing head 81 and the camera 82, and a Z-axis moving mechanism 85 that moves the arm section 83 in the Z-axis direction.

The Z-axis moving mechanism 85 includes a pair of guide rails 86 extending in the Z-axis direction, a Z-axis table 89 mounted on the guide rails 86, a ball screw 87 extending in parallel with the guide rails 86, and a driving motor 88 that rotates the ball screw 87.

The pair of guide rails 86 is disposed on the front surface of the erected wall portion 52 to be parallel with the Z-axis direction. The Z-axis table 89 is installed on the pair of guide rails 86 to be slidable along these guide rails 86. The arm section 83 is attached onto the Z-axis table 89.

The ball screw 87 is screwed into a nut portion (not illustrated) provided in the Z-axis table 89. The driving motor 88 is connected to one end portion of the ball screw 87, and rotationally drives the ball screw 87. When the ball screw 87 is rotationally driven, the Z-axis table 89 and the arm section 83 move in the Z-axis direction along the guide rails 86.

The arm section 83 is attached to the Z-axis table 89 to project in a −Y direction. The processing head 81 is supported by a tip end of the arm section 83 to face the holding table 56 of the holding unit 55.

An optical system (not illustrated) of the laser beam irradiating unit 80, which includes a laser oscillator 78, a condensing lens, and the like, is disposed within the arm section 83 and the processing head 81. The laser beam irradiating unit 80 is configured to apply a laser beam generated with use of the optical system from a lower end of the processing head 81 to the wafer 100 held on the holding table 56. The wavelength of the laser beam applied from the laser beam irradiating unit 80 in the present embodiment is a wavelength absorbable by the wafer 100 as a workpiece.

The transporting apparatus 5 illustrated in FIG. 2 can, for example, hold the frame unit 110 including the wafer 100 by a holding member (not illustrated) such as a robot hand. The transporting apparatus 5 can, for example, unload and load the frame unit 110 from and into an unillustrated housing unit, and transport the frame unit 110 between the first cutting apparatus 2 and the laser processing apparatus 4. Incidentally, a worker may transport the frame unit 110 without using the transporting apparatus 5.

The controller 7 includes a central processing unit (CPU) that performs arithmetic processing according to a control program, a storage medium such as a memory, and the like.

The controller 7 processes the wafer 100 by controlling various members of the processing system 1.

In the following, description will be made of a method of processing the wafer 100 in the processing system 1, which is controlled by the controller 7. The processing method according to the present embodiment is a method of processing the wafer 100 having the plurality of planned dividing lines 103 and 104 formed thereon, along these planned dividing lines 103 and 104.

[Processed Groove Forming Step]

A processed groove forming step will first be described. This step forms processed grooves in the wafer 100 along the first planned dividing lines 103 and the second planned dividing lines 104 illustrated in FIG. 1, with use of the first cutting apparatus 2. The processed groove forming step includes a holding step and a cutting step that are described below.

[Holding Step]

In this step, the transporting apparatus 5 or the worker mounts the wafer 100 of the frame unit 110 illustrated in FIG. 1 onto the holding table 21 of the holding unit 20 in the first cutting apparatus 2 illustrated in FIG. 3 via the dicing tape 113. Further, the clamp units 25 of the holding unit 20 support the annular frame 111 of the frame unit 110. In this state, the controller 7 makes the holding surface 22 of the holding table 21 communicate with the unillustrated suction source, and thereby holds under suction the wafer 100 by the holding surface 22. The frame unit 110 including the wafer 100 is thus held by the holding unit 20.

[Cutting Step]

In this step, the wafer 100 is cut along the plurality of first planned dividing lines 103 formed in the first direction and the second planned dividing lines 104 (see FIG. 1).

Specifically, first, the controller 7 controls the θ table 23 of the holding unit 20 illustrated in FIG. 3, to rotate the holding table 21 such that the first planned dividing lines 103 of the wafer 100 held on the holding surface 22 of the holding table 21 become parallel with the X-axis direction. Thereafter, the controller 7 controls the processing feed mechanism 14 to dispose the holding unit 20 at a predetermined cutting start position below the cutting mechanism 45.

Further, the controller 7 controls the indexing feed mechanism 30 to align the position in the Y-axis direction of the first cutting blade 46 with one first planned dividing line 103 on the wafer 100.

Thereafter, the controller 7 controls the cutting feed mechanism 40 to lower the first cutting blade 46 of the cutting mechanism 45 to a predetermined cutting height for cutting (fully cutting) the wafer 100 held under suction on the holding surface 22 while rotating the first cutting blade 46 at high speed.

Figure 5A:
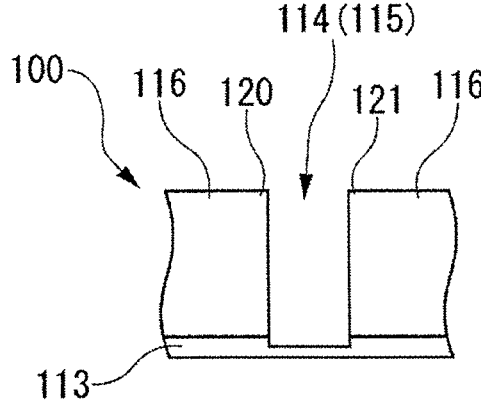
FIG. 5A is a sectional view illustrating an example of a processed groove forming step.

In this state, the controller 7 controls the processing feed mechanism 14 to move the holding unit 20 holding the frame unit 110, in the X-axis direction. Thus, the rotating first cutting blade 46 cuts the wafer 100 along the one first planned dividing line 103. As a result, as illustrated in FIG. 5A, a first processed groove 114 as a processed groove (cut groove) along the first planned dividing line 103 is formed in the wafer 100. In this case, the first processed groove 114 is formed to have such a depth as to cut the wafer 100 and reach the dicing tape 113.

Thereafter, the controller 7 controls the cutting feed mechanism 40 to separate the first cutting blade 46 from the wafer 100 and dispose the first cutting blade 46 above the wafer 100. Further, the controller 7 controls the processing feed mechanism 14 to return the holding unit 20 to the cutting start position. Then, the controller 7 controls the indexing feed mechanism 30 to align the position in the Y-axis direction of the first cutting blade 46 with another first planned dividing line 103 to be cut next on the wafer 100, and cuts the wafer 100 along this first planned dividing line 103. The cutting mechanism 45 thus cuts the wafer 100 along all of the first planned dividing lines 103 on the wafer 100.

Next, the controller 7 controls the θ table 23 of the holding unit 20 illustrated in FIG. 3, to rotate the holding table 21 such that the second planned dividing lines 104 of the wafer 100 held on the holding surface 22 of the holding table 21 become parallel with the X-axis direction.

Thereafter, as in the cutting along the first planned dividing lines 103, the controller 7 controls the processing feed mechanism 14, the indexing feed mechanism 30, the cutting feed mechanism 40, and the cutting mechanism 45 to form second processed grooves 115 along all of the second planned dividing lines 104 in the wafer 100 by the first cutting blade 46, as illustrated in FIG. 5A. The second processed grooves 115 have a depth similar to that of the first processed grooves 114.

Thus, the first processed grooves 114 and the second processed grooves 115 divide the wafer 100 into a plurality of chips 116.

After the cutting step, the frame unit 110 is transported to the laser processing apparatus 4 by the transporting apparatus 5 or the worker.

[Energy Supply Step]

An energy supply step will next be described. This step melts a part of at least one of a groove bottom, a side surface, and an edge surface of the first processed grooves 114 and the second processed grooves 115 formed in the processed groove forming step by, for example, locally (partially) supplying energy to the part, to repair at least part of damage caused by the processed groove forming step. This damage (damage layer) is, for example, a processed altered part (processed altered layer) including a crack, a scratch, chipping, or the like that occurs at a time of the groove formation.

In the present embodiment, the energy supply step applies a laser beam to the edge surfaces of the first processed grooves 114 and the second processed grooves 115 by using the laser processing apparatus 4. The energy supply step includes a holding step and a laser beam irradiating step that are described below. The edge surfaces of the first processed grooves 114 and the second processed grooves 115 are peripheral parts of openings of the first processed grooves 114 and the second processed grooves 115 in the top surface of the wafer 100 illustrated in FIG. 5A (edge portions of the chips 116), and include first edge surface portions 120 and second edge surface portions 121 extending along the processed grooves 114 and 115. Incidentally, the edge surfaces of the processed grooves 114 and 115 can, for example, be expressed as upper surfaces on the sides of the processed grooves 114 and 115.

[Holding Step]

In this step, the transporting apparatus 5 or the worker mounts the wafer 100 of the frame unit 110 illustrated in FIG. 1 onto the holding table 56 of the holding unit 55 in the laser processing apparatus 4 illustrated in FIG. 4 via the dicing tape 113. Further, the clamp units 58 of the holding unit 55 support the annular frame 111 of the frame unit 110. In this state, the controller 7 makes the holding surface 57 of the holding table 56 communicate with the unillustrated suction source, and thereby holds under suction the wafer 100 by the holding surface 57. The frame unit 110 including the wafer 100 is thus held by the holding unit 55.

[Laser Beam Irradiating Step]

In this step, the edge surfaces of the first processed grooves 114 and the second processed grooves 115 are irradiated with a laser beam. Specifically, first, the controller 7 controls the θ table 59 of the holding unit 55 illustrated in FIG. 4, to rotate the holding table 56 such that the first processed grooves 114 of the wafer 100 held on the holding surface 57 of the holding table 56 become parallel with the X-axis direction. Thereafter, the controller 7 controls the X-axis moving mechanism 70 to dispose the holding unit 55 at a predetermined irradiation start position below the processing head 81 of the laser beam irradiating unit 80.

Further, the controller 7 controls the Y-axis moving mechanism 60 to dispose, below the processing head 81, the first edge surface portion 120 (see FIG. 5A) of one first processed groove 114 in the wafer 100. In addition, the controller 7 controls the Z-axis moving mechanism 85 of the laser beam irradiating unit 80 to adjust the height of the processing head 81 appropriately.

Figure 5B:
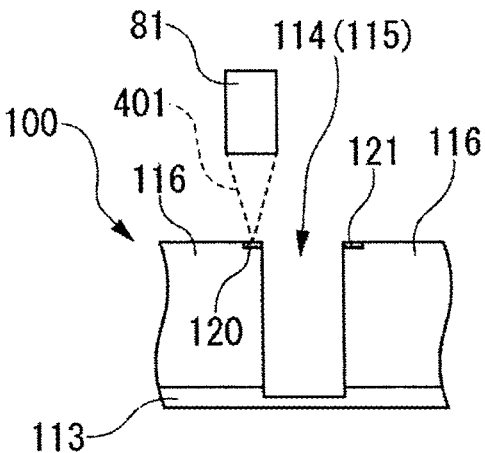
FIG. 5B is a sectional view illustrating an example of an energy supply step.

In this state, the controller 7 controls the optical system of the laser beam irradiating unit 80 to generate a laser beam and apply the laser beam downward from the processing head 81, and controls the X-axis moving mechanism 70 to move the holding unit 55 holding the frame unit 110 in the X-axis direction. Thus, as illustrated in FIG. 5B, a laser beam 401 output from the processing head 81 is applied along the first edge surface portion 120 of the one first processed groove 114.

Thereafter, the controller 7 stops the application of the laser beam 401, and controls the X-axis moving mechanism 70 to return the holding unit 55 to the irradiation start position. Then, the controller 7 controls the Y-axis moving mechanism 60 to dispose the second edge surface portion 121 of the first processed groove 114 below the processing head 81, and applies the laser beam 401 along the second edge surface portion 121.

The controller 7 thus applies the laser beam 401 along the first edge surface portions 120 and the second edge surface portions 121 of all of the first processed grooves 114 in the wafer 100.

Next, the controller 7 controls the θ table 59 of the holding unit 55 illustrated in FIG. 4 to rotate the holding table 56 such that the second processed grooves 115 of the wafer 100 held on the holding surface 57 of the holding table 56 become parallel with the X-axis direction.

Thereafter, as in the laser irradiation along the first processed grooves 114, the controller 7 controls the Y-axis moving mechanism 60, the X-axis moving mechanism 70, and the laser beam irradiating unit 80 to apply the laser beam 401 along the first edge surface portions 120 and the second edge surface portions 121 of all of the second processed grooves 115.

As described above, after the processed groove forming step, the present embodiment performs the energy supply step to supply energy to the first edge surface portions 120 and the second edge surface portions 121 of the first processed grooves 114 and the second processed grooves 115 of the wafer 100 by irradiating the first edge surface portions 120 and the second edge surface portions 121 with the laser beam 401. The first edge surface portions 120 and the second edge surface portions 121 are thereby melted by the laser beam 401.

In addition, the present embodiment uses the laser beam 401 of a wavelength absorbable by the wafer 100, and thus melts not only the top surfaces of the first edge surface portions 120 and the second edge surface portions 121 but also parts reaching a predetermined thickness from the top surfaces (top surface neighboring parts). Further, the melted regions of the first edge surface portions 120 and the second edge surface portions 121 are cooled and solidified after the laser irradiation.

By such melting and cooling processes, the present embodiment can form a seed crystal by effecting crystal growth in the melted regions of the first edge surface portions 120 and the second edge surface portions 121 as parts irradiated with the laser beam 401 (laser-irradiated parts), and thereafter effect recrystallization. Hence, the top surfaces of the first edge surface portions 120 and the second edge surface portions 121 can be planarized. Further, it is possible to bond cracks, chipping, and the like generated in the top surfaces of the first edge surface portions 120 and the second edge surface portions 121 and the top surface neighboring parts during the formation of the first processed grooves 114 and the second processed grooves 115. It is thus possible to reduce damage to the first edge surface portions 120 and the second edge surface portions 121. That is, at least part of the damage can be repaired (or removed). As a result, the transverse rupture strength of the chips 116 formed by dividing the wafer 100 can be enhanced.

In addition, the energy supply step locally (partially) irradiates a part of one of the groove bottom, the side surface, and the edge surface of the first processed grooves 114 and the second processed grooves 115 with the laser beam to repair the damage caused by the processed groove forming step. Thus, even in a case where devices are formed on the top surface of the wafer 100, the laser beam can be inhibited from adversely affecting the devices. In addition, locally applying the laser beam can shorten the time taken for the energy supply step. Productivity can thus be improved.

Incidentally, there is a method referred to as laser cleaning that scrapes processing waste adhering to a processed groove due to the application of the laser beam, after the formation of the processed groove. In regard to this, laser cleaning performs ablation by irradiating the processed groove with a laser beam of an ultraviolet (UV) wavelength and making the processing waste adhering to the top surface of the processed groove absorb the laser beam, and thereby removes the processing waste. That is, laser cleaning is performed to sublime and remove the processing waste adhering to the top surface.

On the other hand, by applying the laser beam 401, the present embodiment not only planarizes the top surfaces of the laser-irradiated parts such as the first edge surface portions 120 and the second edge surface portions 121 in the wafer 100 but also repairs damage by bonding cracks or the like formed internally (in the top surface neighboring parts). Accordingly, the laser beam 401 is preferably not absorbed too much by the top surfaces of the laser-irradiated parts. Hence, the present embodiment preferably melts the top surfaces of the laser-irradiated parts and the parts reaching a predetermined thickness from the top surfaces (top surface neighboring parts) by using the laser beam 401 having a wavelength longer than a wavelength applied in laser cleaning, for example, a wavelength in a range of 500 to 1000 nm. The top surface neighboring parts are, for example, parts having a thickness of approximately 0.5 to 1.5 μm or 0.5 to 4 μm from the top surfaces.

Figure 6A:
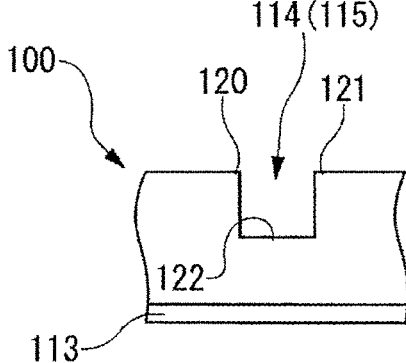
FIG. 6A is a sectional view illustrating another example of the processed groove forming step.

Incidentally, in the foregoing embodiment, the controller 7 in the cutting step of the processed groove forming step sets the height of the first cutting blade 46 of the cutting mechanism 45 at a height for cutting (fully cutting) the wafer 100, thereby forms the first processed grooves 114 and the second processed grooves 115 having such a depth as to cut the wafer 100 and reach the dicing tape 113, and thus divides the wafer 100 into the plurality of chips 116. In regard to this, in the cutting step of the processed groove forming step, the wafer 100 may be half cut by setting the height of the first cutting blade 46 of the cutting mechanism 45 higher than the height for cutting the wafer 100. In this case, as illustrated in FIG. 6A, the first processed grooves 114 and the second processed grooves 115 are formed to have a depth not reaching the dicing tape 113.

In addition, in this case, the laser beam 401 is preferably applied to not only the first edge surface portions 120 and the second edge surface portions 121 but also groove bottoms 122 of the first processed grooves 114 and the second processed grooves 115.

Figure 6B:
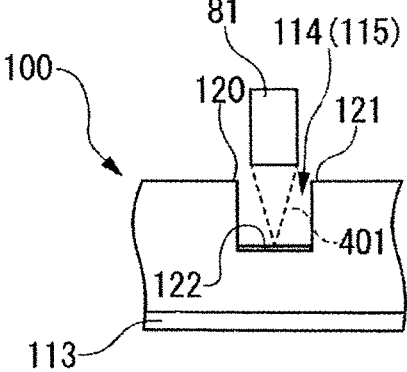
FIG. 6B is a sectional view illustrating another example of the energy supply step.
Figure 6C:
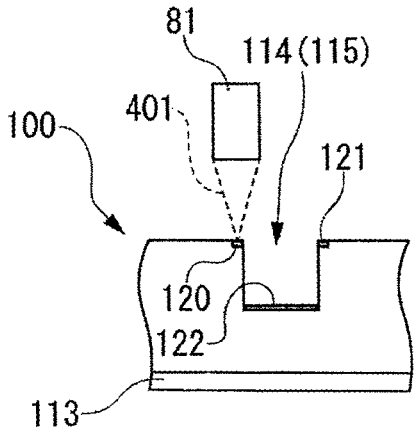
FIG. 6C is a sectional view illustrating yet another example of the energy supply step.

Specifically, in this case, as illustrated in FIG. 6B, the controller 7 in the laser beam irradiating step of the energy supply step applies the laser beam 401 output from the processing head 81, along the groove bottom 122 of a first processed groove 114 (second processed groove 115). Thereafter, as illustrated in FIG. 6C, the controller 7 applies the laser beam 401 along the first edge surface portion 120 and the second edge surface portion 121 of the first processed groove 114 (second processed groove 115). This configuration can reduce damage to not only the first edge surface portion 120 and the second edge surface portion 121 but also the groove bottom 122.

Incidentally, the controller 7 preferably adjusts the position in the Y-axis direction of the laser beam 401 as appropriate by using the Y-axis moving mechanism 60, for example, such that the entire surface of the groove bottom 122 is irradiated with the laser beam 401.

In addition, it may be difficult to irradiate vicinities of corners of the groove bottom 122 with the laser beam 401 from the processing head 81 from the upside. In such a case, the vicinities of the corners of the groove bottom 122 may be irradiated with the laser beam 401 obliquely by the processing head 81 being inclined or the direction of the laser beam 401 output from the processing head 81 being changed by a mirror (not illustrated in FIG. 6C). Such a mirror is, for example, disposed within the processing head 81 in the laser beam irradiating unit 80 (such as depicted by mirror 79 in FIG. 4).

Figure 7A:
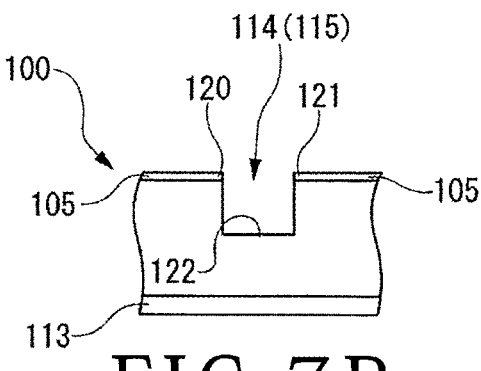
FIG. 7A is a sectional view illustrating yet another example of the processed groove forming step.

Incidentally, as illustrated in FIG. 7A, a functional layer 105 may be laminated on the top surface (device surface) of the wafer 100. The functional layer 105, for example, has a configuration in which a low-k film (low dielectric film), devices, a wiring layer, and the like are laminated.

Figure 7B:
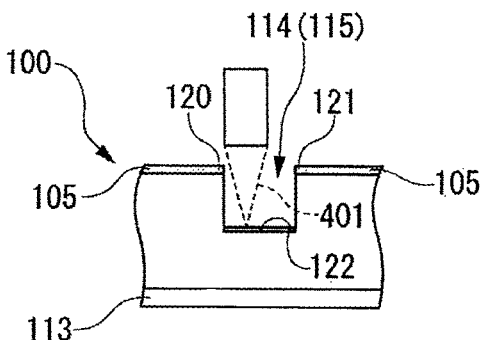
FIG. 7B is a sectional view illustrating yet another example of the energy supply step.

With this configuration, it is preferable that the processed groove forming step remove the functional layer 105 and half cut the wafer 100, and thereby form the first processed grooves 114 and the second processed grooves 115 not reaching the dicing tape 113, and that the energy supply step irradiate the groove bottoms 122 of the first processed grooves 114 and the second processed grooves 115 with the laser beam 401, as illustrated in FIG. 7B.

Further, in a case where the wafer 100 is provided with the functional layer 105, the energy supply step may supply energy to a part including the functional layer 105 in at least one of the groove bottom, the side surface, and the edge surface of the first processed grooves 114 and the second processed grooves 115, to repair at least part of damage caused to this part. That is, in the example illustrated in FIG. 7B, the laser beam 401 may be applied to the first edge surface portions 120 and the second edge surface portions 121 of the first processed grooves 114 and the second processed grooves 115 which include the functional layer 105, and the functional layer 105 may thereby be melted to remove the damage.

Incidentally, in a case where the wafer 100 has a thick functional layer 105, the functional layer 105 may, for example, be thicker than a substrate as a main body of the wafer 100. For example, there is a case where the thickness of the substrate is approximately 10 μm, whereas the thickness of the functional layer is 20 to 30 μm. In the case where the functional layer 105 is thick as described above, damage caused to the functional layer 105 affects the transverse rupture strength of the chips when the wafer 100 is formed into the chips.

Hence, in the case where the functional layer 105 is thick, it is particularly effective to irradiate, with the laser beam 401, at least one of the edge surface, the side surface, and the groove bottom of the first processed grooves 114 and the second processed grooves 115 formed in the functional layer 105 (that is, one of parts formed of the functional layer 105 at the processed grooves 114 and 115), and thereby melt and solidify the irradiated part to repair part of the damage.

Thus, in the case where the wafer 100 is provided with the functional layer 105, a part including the functional layer 105 and/or a part including the substrate in at least one of the groove bottom, the side surface, and the edge surface of the processed grooves 114 and 115 may be melted by being irradiated with the laser beam 401, and thereby part of the damage may be repaired.

Incidentally, a case where the groove bottoms 122 of the processed grooves 114 and 115 include the functional layer 105 is, for example, a case where the processed grooves 114 and 115 include only the functional layer 105 (case where the processed grooves 114 and 115 do not reach the substrate). Such processed grooves 114 and 115 are formed in a case where the substrate is desired not to be irradiated with the laser beam, for example. In addition, in a case where the functional layer 105 is irradiated with the laser beam, the power of the laser beam 401 is preferably limited to a degree that an outermost layer of the surface irradiated with the laser beam 401 is melted, to prevent new damage from being caused to the functional layer 105 by the heat of the laser beam 401.

Figure 8:
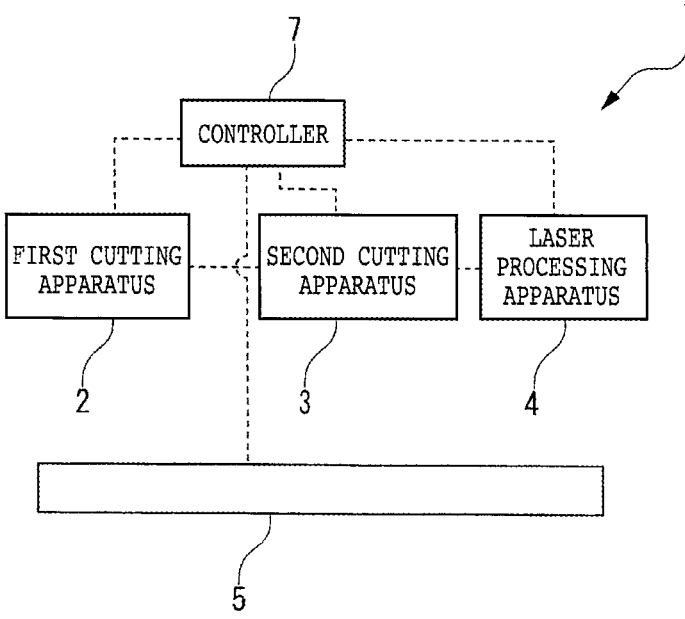
FIG. 8 is a block diagram illustrating another configuration of the processing system.

In addition, in a case where the functional layer 105 is laminated on the top surface of the wafer 100, the wafer 100 may be subjected to a processing method as follows. In this case, as illustrated in FIG. 8, the processing system 1 further includes a second cutting apparatus 3 in addition to the first cutting apparatus 2, the laser processing apparatus 4, the transporting apparatus 5, and the controller 7 illustrated in FIG. 2. The second cutting apparatus 3 has a second cutting blade 47 thinner than the first cutting blade 46 of the first cutting apparatus 2 in the configuration of the first cutting apparatus 2 illustrated in FIG. 3.

Figure 9A:
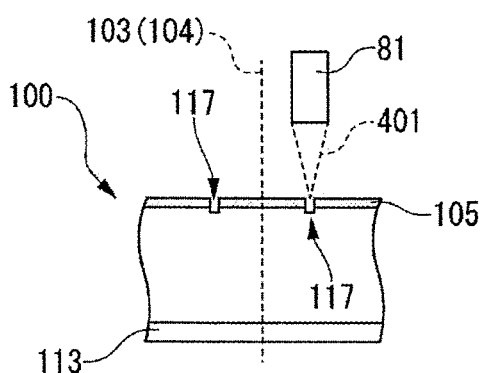
FIG. 9A is a sectional view illustrating a functional layer removing step.

In this processing method, before the processed groove forming step performs cutting processing using the first cutting apparatus 2, the controller 7 irradiates both sides of each of the first planned dividing lines 103 and the second planned dividing lines 104 on the wafer 100 with the laser beam 401 from the processing head 81 by using the laser processing apparatus 4, as illustrated in FIG. 9A. Consequently, the functional layer 105 on both sides of each of the first planned dividing lines 103 and the second planned dividing lines 104 is removed to form a pair of processing preliminary grooves 117 (functional layer removing step of the processed groove forming step). The depth of the processing preliminary grooves 117 is a depth of removing at least the functional layer 105. In addition, an interval between the pair of processing preliminary grooves 117 is larger than the width of first processed grooves 114 and second processed grooves 115 to be formed later.

Figure 9B:
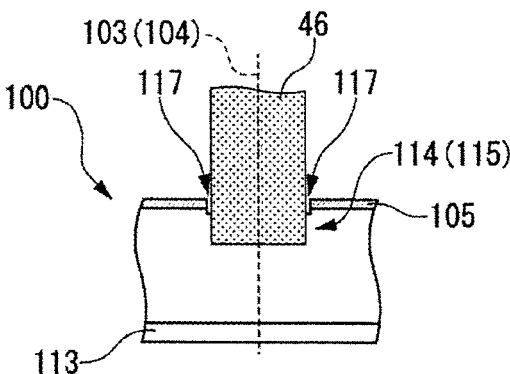
FIG. 9B is a sectional view illustrating yet another example of the processed groove forming step.

Thereafter, the frame unit 110 including the wafer 100 is transported to the first cutting apparatus 2. Then, the controller 7 cuts a portion between the pair of processing preliminary grooves 117 by using the first cutting blade 46 of the first cutting apparatus 2. Consequently, as illustrated in FIG. 9B, each of first processed grooves 114 along the first planned dividing lines 103 and second processed grooves 115 along the second planned dividing lines 104 is formed between the pair of processing preliminary grooves 117 in the wafer 100 (cutting step of the processed groove forming step). In this case, the first processed grooves 114 and the second processed grooves 115 are formed to have a depth not reaching the dicing tape 113.

Figure 9C:
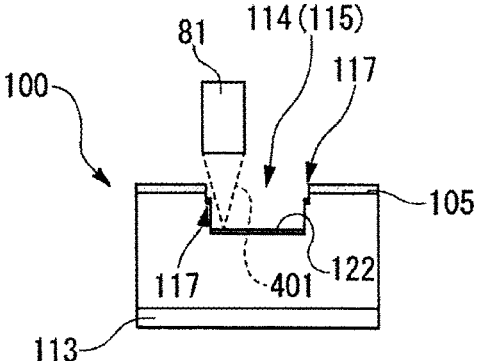
FIG. 9C is a sectional view illustrating yet another example of the energy supply step.

Thereafter, the frame unit 110 including the wafer 100 is transported to the laser processing apparatus 4. Then, as illustrated in FIG. 9C, the controller 7 irradiates the groove bottoms 122 of the first processed grooves 114 and the second processed grooves 115 with the laser beam 401 by the processing head 81 of the laser processing apparatus 4, to repair damage caused to the groove bottoms 122 (energy supply step). In addition, the energy supply step may irradiate also at least one of a groove bottom, an edge surface, and a side surface of the pair of processing preliminary grooves 117 with the laser beam 401 to repair damage caused to the groove bottom, the side surface, and the edge surface of the processing preliminary grooves 117 (peripheral parts of an opening) by the functional layer removing step of the processed groove forming step.

Figure 9D:
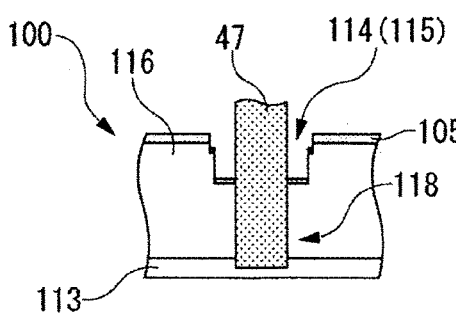
FIG. 9D is a sectional view illustrating an example of a dividing step.

Next, the frame unit 110 including the wafer 100 is transported to the second cutting apparatus 3. Then, as illustrated in FIG. 9D, by using the second cutting blade 47 of the second cutting apparatus 3, the controller 7 cuts (fully cuts) the groove bottoms 122 of the first processed grooves 114 and the second processed grooves 115 to form dividing grooves 118 having a depth reaching the dicing tape 113. The wafer 100 is thereby divided into a plurality of chips 116 (dividing step).

As illustrated in FIG. 9B, in the cutting step of the processed groove forming step in this processing method, the first cutting blade 46 of the first cutting apparatus 2 cuts a portion between the processing preliminary grooves 117 from which the functional layer 105 is removed. Hence, the first cutting blade 46 can be prevented from peeling off the functional layer 105 from the top surface of the wafer 100 on both sides of the first processed grooves 114 and the second processed grooves 115.

In addition, before the groove bottoms 122 of the first processed grooves 114 and the second processed grooves 115 are fully cut, damage caused to the groove bottoms 122 is repaired by irradiation of the groove bottoms 122 with the laser beam 401. Consequently, the transverse rupture strength of the chips 116 formed by the full cut can be improved.

Incidentally, in a case where the processing method illustrated in FIGS. 9A to 9D is performed, the first cutting apparatus 2 as what is generally called a dual dicer having two cutting blades, which are the relatively thick first cutting blade 46 and the relatively thin second cutting blade 47, may be used instead of the use of two cutting apparatuses, which are the first cutting apparatus 2 and the second cutting apparatus 3, as illustrated in FIG. 8. Further, the first cutting apparatus 2 may perform both the formation of the first processed grooves 114 and the second processed grooves 115 by the first cutting blade 46 illustrated in FIG. 9B and the formation of the dividing grooves 118 by the second cutting blade 47 illustrated in FIG. 9D.

Alternatively, the processing system 1 may perform the processing method illustrated in FIGS. 9A to 9D by one processing apparatus having both of functions as the dual dicer described above and a laser processing function similar to that of the laser processing apparatus 4.

In addition, in the foregoing embodiment, as illustrated in FIG. 2 or FIG. 8, the processing system 1 includes the first cutting apparatus 2 in order to form the first processed grooves 114 and the second processed grooves 115 in the wafer 100. In regard to this, the processing system 1 may include a groove forming laser processing apparatus for forming the first processed grooves 114 and the second processed grooves 115, which is separate from the laser processing apparatus 4, in place of the first cutting apparatus 2.

The groove forming laser processing apparatus, for example, has a configuration similar to that of the laser processing apparatus 4 illustrated in FIG. 4. However, the laser beam for forming the first processed grooves 114 and the second processed grooves 115 and the laser beam for repairing damage caused to the wafer 100 are different from each other in wavelength and power or the like. The groove forming laser processing apparatus is hence configured to apply a laser beam suitable for forming the first processed grooves 114 and the second processed grooves 115.

Alternatively, in the processing system 1, the laser processing apparatus 4 may include two kinds of laser oscillators, and may be configured to be able to apply a laser beam suitable for forming the first processed grooves 114 and the second processed grooves 115 and a laser beam suitable for repairing damage caused to the wafer 100 while switching between the laser beams. In this case, the processing system 1 can perform the processed groove forming step and the energy supply step described above by one laser processing apparatus 4.

In addition, in the foregoing embodiment, the energy supply step irradiates the edge surfaces (the first edge surface portions 120 and the second edge surface portions 121) and/or the groove bottoms 122 of the first processed grooves 114 and the second processed grooves 115 with the laser beam 401. In regard to this, the side surfaces of the first processed grooves 114 and the second processed grooves 115 may be irradiated with the laser beam 401.

Figure 10:
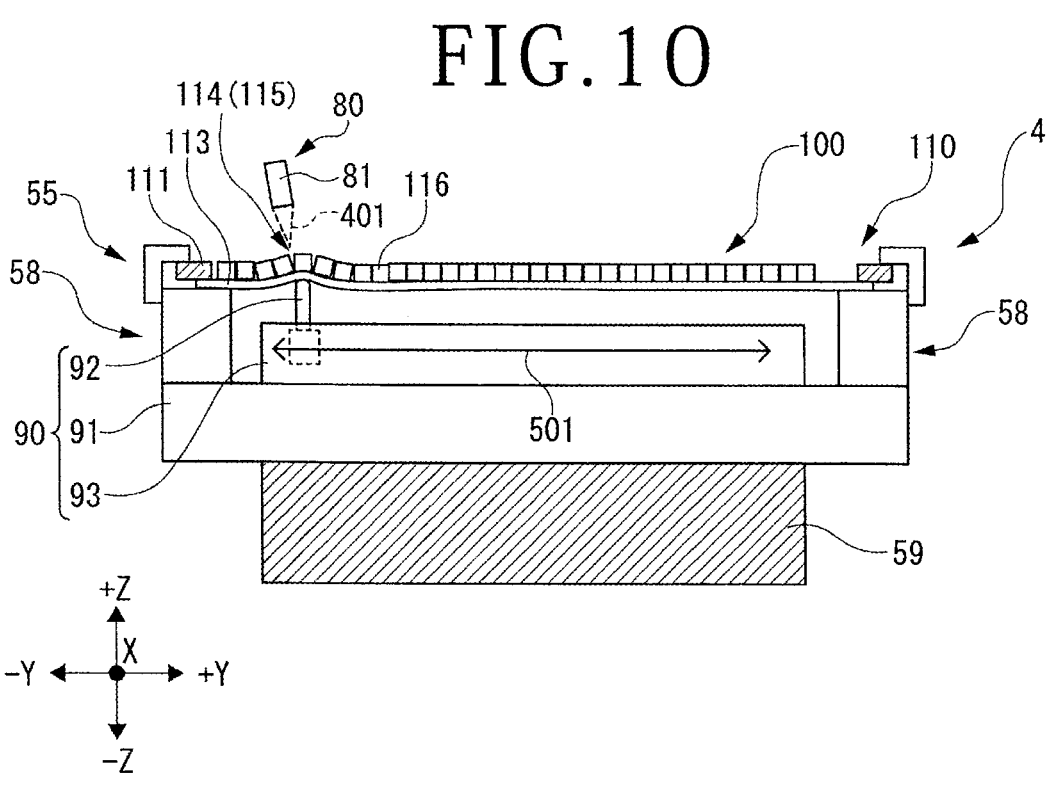
FIG. 10 is a sectional view illustrating another example of a holding unit in the laser processing apparatus.

In this case, for example, as illustrated in FIG. 10, the holding unit 55 of the laser processing apparatus 4 illustrated in FIG. 4 includes a holding mechanism 90 in place of the holding table 56.

The holding mechanism 90 includes, on the periphery of a holding table 91, clamp units 58 for holding and fixing the annular frame 111 on the periphery of the wafer 100. In addition, the holding mechanism 90 includes a ball screw type moving mechanism 93 fixed on the holding table 91 and a pushing-up member 92 supported by the moving mechanism 93.

Figure 11:
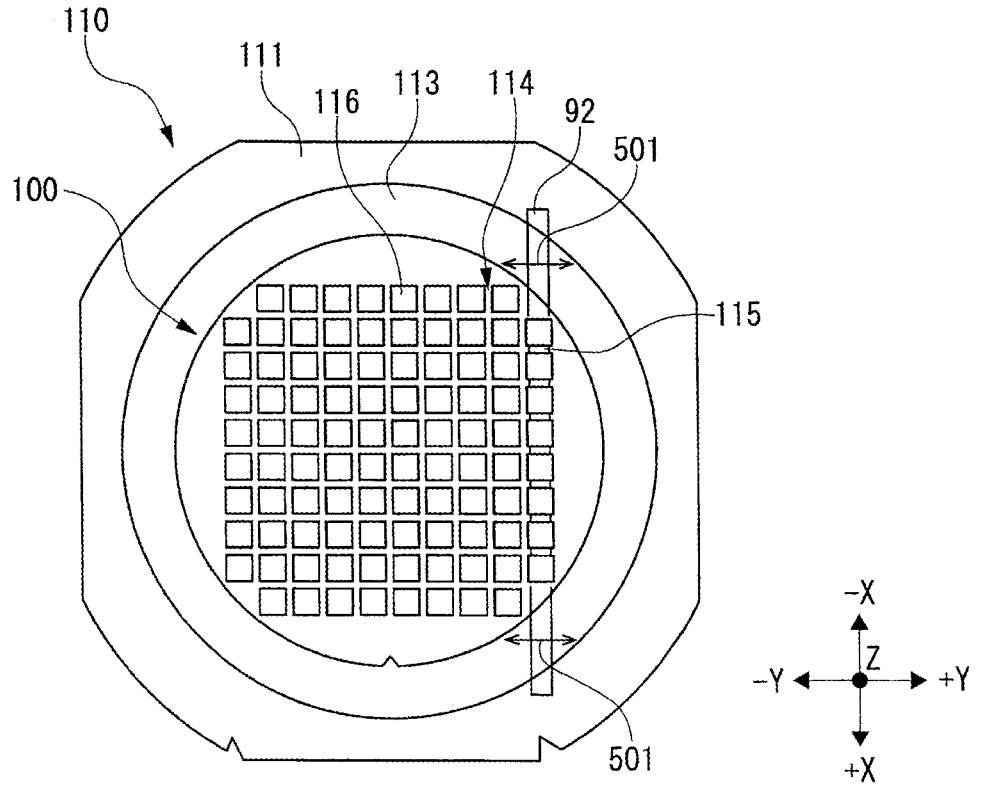
FIG. 11 is a plan view illustrating a pushing-up member.

The moving mechanism 93 can move the pushing-up member 92 along the Y-axis direction as indicated by an arrow 501 in FIG. 10 and FIG. 11, and move the pushing-up member 92 in the upward-downward direction. As illustrated in FIG. 11, the pushing-up member 92 is a substantially plate-shaped member longer than the diameter of the wafer 100, and extends in the diametrical direction of the wafer 100 to be in contact with the wafer 100 via the dicing tape 113. The width of a part in contact with the wafer 100 in the pushing-up member 92 is substantially the same as the width of the chips 116 obtained by dividing the wafer 100 by the first processed grooves 114 and the second processed grooves 115.

With this configuration, as illustrated in FIG. 5A, the processed groove forming step forms the first processed grooves 114 and the second processed grooves 115 for dividing the wafer 100 into the plurality of chips 116.

Then, in the energy supply step, the clamp units 58 of the holding unit 55 in the laser processing apparatus 4 illustrated in FIG. 10 support the annular frame 111 of the frame unit 110 (holding step).

Then, as illustrated in FIG. 10, the controller 7 adjusts the Y-axis moving mechanism 60 (see FIG. 4) and the θ table 59 such that the laser beam 401 output from the processing head 81 is applied to one column of chips 116 along one first processed groove 114 extending in the X-axis direction. Further, the controller 7 adjusts the inclination of the processing head 81 such that the laser beam 401 output from the processing head 81 is obliquely applied with respect to the top surface of the wafer 100. Incidentally, the laser beam 401 may be inclined by a mirror (such as depicted by mirror 79 in FIG. 4) disposed inside the processing head 81 instead of the inclination of the processing head 81 being adjusted.

Figures 12, 13:
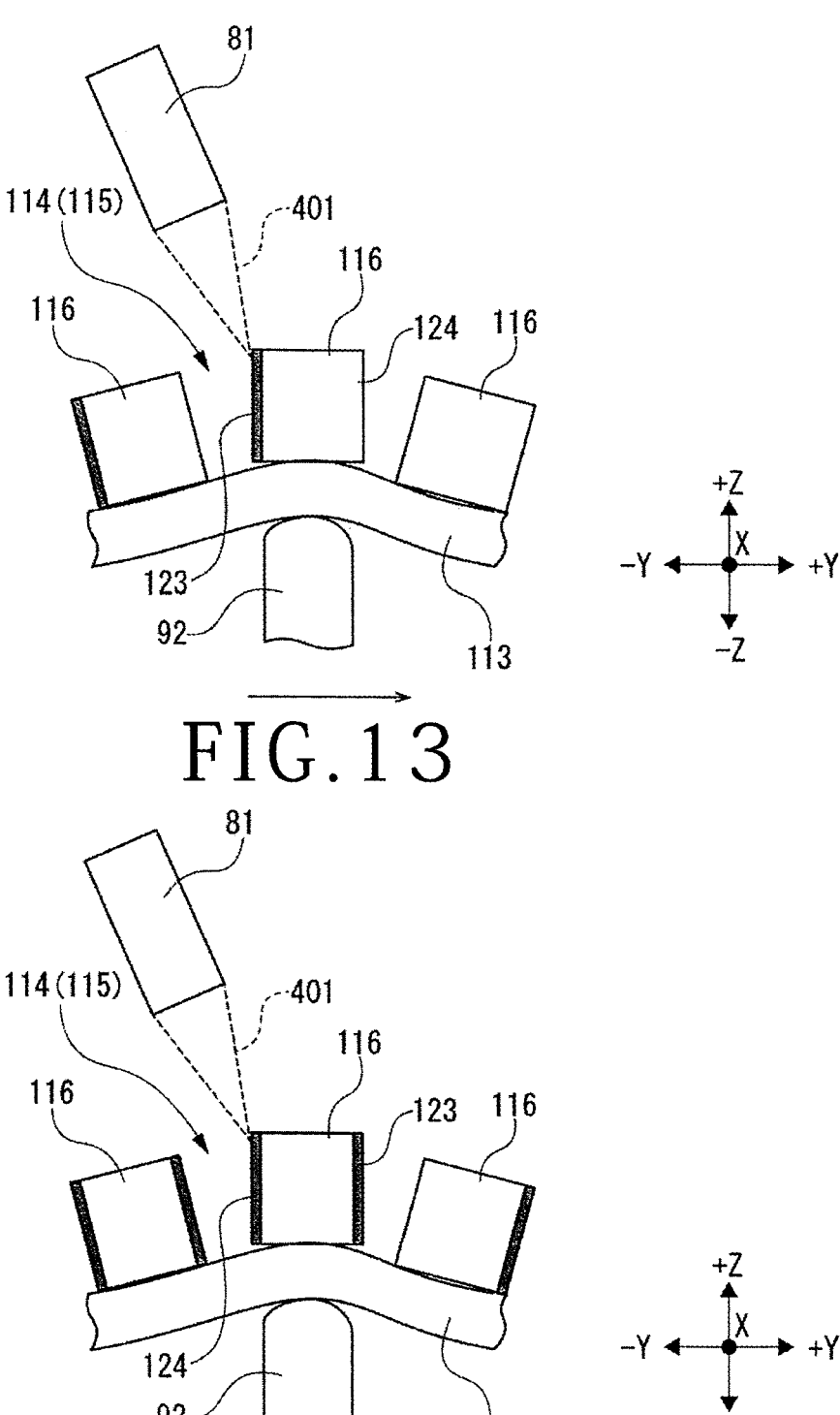
FIG. 12 is a sectional view illustrating another example of the energy supply step.
FIG. 13 is a sectional view illustrating another example of the energy supply step.

In this state, the controller 7 controls the holding mechanism 90 to position the pushing-up member 92 below the one column of chips 116 to be irradiated with the laser beam 401 (chips 116 to be supplied with energy), and push up these chips 116 relative to the other chips 116 by the pushing-up member 92. Consequently, as illustrated in FIG. 12, the controller 7 exposes a first side surface 123 as one of two side surfaces parallel with the X-axis direction among four side surfaces of each of the chips 116 to be irradiated with the laser beam 401, such that the first side surface 123 faces the processing head 81 (side surface exposing step). Incidentally, the side surfaces of the chips 116 correspond to the side surfaces of the first processed grooves 114 and the second processed grooves 115.

In this state, the controller 7 applies the laser beam 401 from the processing head 81, and moves the holding unit 55 in the X-axis direction by the X-axis moving mechanism 70 (see FIG. 4). Thus, the exposed first side surfaces 123 of the pushed-up one column of chips 116 are sequentially supplied with energy by being irradiated with the laser beam 401 from the processing head 81. Incidentally, the controller 7 preferably adjusts the inclination of the laser beam 401 as appropriate such that the first side surfaces 123 are in whole irradiated with the laser beam 401.

Thereafter, the controller 7 changes the column of chips 116 to be irradiated with the laser beam 401 by the Y-axis moving mechanism 60 (see FIG. 4), and controls the moving mechanism 93 to push up these chips 116 by the pushing-up member 92. The controller 7 then irradiates the first side surfaces 123 of the chips 116 with the laser beam 401. The controller 7 thus irradiates the first side surfaces 123 of all of the chips 116 on the wafer 100 with the laser beam 401.

Next, the controller 7 rotates the orientation of the frame unit 110 including the wafer 100 by 180 degrees by the θ table 59 (see FIG. 10), and irradiates second side surfaces 124 of chips 116 which are opposite to the first side surfaces 123 with the laser beam 401, as illustrated in FIG. 13.

The controller 7 thus irradiates the four side surfaces of each chip 116 in the wafer 100 with the laser beam 401 while changing the orientation of the frame unit 110 by the θ table 59. Consequently, all of the side surfaces of the chips 116 can be melted to repair at least part of damage caused to the side surfaces.

In addition, as described above, the laser beam irradiating unit 80 outputs the laser beam of a wavelength absorbable by the wafer 100. For example, in a case where the wafer 100 is a silicon wafer, the wavelength of the laser beam output from the laser beam irradiating unit 80 is a wavelength in a range of 500 to 1000 nm as wavelengths absorbable by silicon.

FIG. 14 is a diagram illustrating a table of relations between the wavelengths of laser beams output from the laser beam irradiating unit 80 and results of the energy supply step performed with use of the respective laser beams (processing results). As illustrated in this table, in a case where the wavelength fell within the range of 500 to 1000 nm, a laser-irradiated part of the wafer 100 as a silicon wafer was able to be melted satisfactorily.

In a case where the wavelength was 355 nm or less, on the other hand, it was difficult to sufficiently melt the laser-irradiated part of the wafer 100 as a silicon wafer. In addition, in a case where the wavelength was 1064 nm, the laser beam passed through the wafer 100, and it was hence difficult to melt the laser-irradiated part satisfactorily.

Incidentally, in the present embodiment, a material for the wafer 100 as a workpiece is preferably a material in which liquid phase growth occurs, such as silicon (Si), germanium (Ge), gallium arsenide (GaAs), and the like. A material in which liquid phase growth occurs is easily melted by the application of the laser beam. Thus, damage to the wafer 100 can be repaired satisfactorily by the application of the laser beam.

Incidentally, in the energy supply step, it suffices to be able to repair at least part of damage caused at times of formation of the first processed grooves 114 and the second processed grooves 115, by supply of energy to at least a part of the first processed grooves 114 and the second processed grooves 115 so as not to produce an adverse effect on devices formed on the wafer 100. Hence, in the energy supply step, energy may be supplied in any form. For example, the damage may be repaired by application of plasma, an ion beam, or the like instead of application of the laser beam.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a plurality of intersecting planned dividing lines formed on a top surface of the wafer, along the planned dividing lines, the wafer processing method comprising:

a processed groove forming step of forming processed grooves along the planned dividing lines, wherein each processed groove includes a groove bottom located between a first edge surface portion and a second edge surface portion;

a first energy supply step of melting a part of the first edge surface portion of the processed grooves by supplying energy to the first edge surface portion, to repair at least part of damage caused by the processed groove forming step;

a second energy supply step of melting a part of the second edge surface portion of the processed grooves by supplying energy to the second edge surface portion, to repair at least part of damage caused by the processed groove forming step, wherein the second energy supply step follows the first energy supply step; and an additional energy supply step of melting the groove bottom of the processed grooves by supplying energy to the part, to repair at least part of damage caused by the processed groove forming step, wherein both the first energy supply step and the second energy supply step are steps of applying a laser beam, wherein the laser beam is inclined for at least a portion of the additional energy supply step so that corners adjacent the groove bottom can be irradiated by the laser beam, and wherein the laser beam is inclined by inclining a processing head associated with the laser beam.

2. The wafer processing method according to claim 1, wherein:

a functional layer is laminated on the wafer, and the processed groove forming step includes forming a pair of processing preliminary grooves having a depth of removing at least the functional layer and forming a processed groove between the pair of processing preliminary grooves.

3. The wafer processing method according to claim 1, wherein a wavelength of the laser beam is a wavelength absorbable by the wafer.

4. The wafer processing method according to claim 1, wherein a wavelength of the laser beam is a wavelength in a range of 500 to 1000 nm.

5. The wafer processing method according to claim 1, wherein:

a functional layer is laminated on the wafer, and at least one of the first energy supply step and the second energy supply step supplies the energy to a part including the functional layer in at least one of the groove bottom, the side surface, and the edge surface of the processed grooves, to repair at least part of damage caused to the part including the functional layer.

6. A wafer processing method for processing a wafer having a plurality of intersecting planned dividing lines formed on a top surface of the wafer, along the planned dividing lines, the wafer processing method comprising:

a processed groove forming step of forming processed grooves along the planned dividing lines; and an energy supply step of melting a part of at least one of a groove bottom, a side surface, and an edge surface of the processed grooves by supplying energy to the part, to repair at least part of damage caused by the processed groove forming step, wherein the processed groove forming step divides the wafer into a plurality of chips by the processed grooves, and wherein the energy supply step further includes a side surface exposing step of exposing side surfaces of chips to be supplied with the energy, by pushing up the chips to be supplied with the energy relative to the other chips, and supplies the side surfaces exposed in the side surface exposing step with the energy.

7. A wafer processing method for processing a wafer having a plurality of intersecting planned dividing lines formed on a top surface of the wafer, along the planned dividing lines, the wafer processing method comprising:

a processed groove forming step of forming processed grooves along the planned dividing lines, wherein each processed groove includes a groove bottom located between a first edge surface portion and a second edge surface portion;

a first energy supply step of melting a part of the first edge surface portion of the processed grooves by supplying energy to the first edge surface portion, to repair at least part of damage caused by the processed groove forming step; and a second energy supply step of melting a part of the second edge surface portion of the processed grooves by supplying energy to the second edge surface portion, to repair at least part of damage caused by the processed groove forming step, wherein the second energy supply step follows the first energy supply step, and an additional energy supply step of melting the groove bottom of the processed grooves by supplying energy to the part, to repair at least part of damage caused by the processed groove forming step, wherein both the first energy supply step and the second energy supply step are steps of applying a laser beam, wherein the laser beam is inclined for at least a portion of the additional energy supply step so that corners adjacent the groove bottom can be irradiated by the laser beam, and wherein the laser beam is inclined by using a mirror to change a direction of the laser beam.

8. The wafer processing method according to claim 7, wherein:

a functional layer is laminated on the wafer, and the processed groove forming step includes forming a pair of processing preliminary grooves having a depth of removing at least the functional layer and forming a processed groove between the pair of processing preliminary grooves.

9. The wafer processing method according to claim 7, wherein a wavelength of the laser beam is a wavelength absorbable by the wafer.

10. The wafer processing method according to claim 7, wherein a wavelength of the laser beam is a wavelength in a range of 500 to 1000 nm.

11. The wafer processing method according to claim 7, wherein:

a functional layer is laminated on the wafer, and at least one of the first energy supply step and the second energy supply step supplies the energy to a part including the functional layer in at least one of the groove bottom, the side surface, and the edge surface of the processed grooves, to repair at least part of damage caused to the part including the functional layer.

* * * * *